(12) United States Patent
Leng et al.

(10) Patent No.: US 7,829,428 B1
(45) Date of Patent: Nov. 9, 2010

(54) METHOD FOR ELIMINATING A MASK LAYER DURING THIN FILM RESISTOR MANUFACTURING

(75) Inventors: Yaojian Leng, Grapevine, TX (US); Rodney Hill, Mansfield, TX (US); Terry Lines, Mansfield, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 18 days.

(21) Appl. No.: 12/229,689

(22) Filed: Aug. 26, 2008

(51) Int. Cl.
*H01L 21/20* (2006.01)
(52) U.S. Cl. ............................. 438/384; 257/E27.047
(58) Field of Classification Search ......... 438/381–385; 257/E27.047
See application file for complete search history.

(56) References Cited

U.S. PATENT DOCUMENTS

| | | |
|---|---|---|
| 4,843,033 A | 6/1989 | Plumton et al. |
| 4,847,673 A | 7/1989 | Matsukawa |
| 5,203,957 A | 4/1993 | Yoo et al. |
| 5,316,978 A | 5/1994 | Boyd et al. |
| 5,346,585 A | 9/1994 | Doan et al. |
| 5,362,669 A | 11/1994 | Boyd et al. |
| 5,384,278 A | 1/1995 | Singlevich |
| 5,461,000 A | 10/1995 | Liang |
| 5,547,896 A | 8/1996 | Linn et al. |
| 5,814,547 A | 9/1998 | Chang |
| 5,970,374 A | 10/1999 | Teo |
| 6,004,882 A | 12/1999 | Kim et al. |
| 6,097,095 A | 8/2000 | Chung |
| 6,100,154 A | 8/2000 | Hsu et al. |
| 6,117,789 A | 9/2000 | Lee |
| 6,165,862 A | 12/2000 | Ishikawa et al. |
| 6,171,929 B1 | 1/2001 | Yang et al. |
| 6,232,194 B1 | 5/2001 | Yaung et al. |
| 6,279,585 B1 | 8/2001 | Shiraki et al. |
| 6,297,126 B1 | 10/2001 | Lim et al. |
| 6,326,256 B1 | 12/2001 | Bailey et al. |
| 6,413,835 B1 | 7/2002 | Norstrom et al. |
| 6,417,093 B1 | 7/2002 | Xie et al. |
| 6,498,385 B1 | 12/2002 | Daubenspeck et al. |
| 6,534,374 B2 | 3/2003 | Johnson et al. |
| 6,559,047 B1 | 5/2003 | Doohan |
| 6,570,239 B2 | 5/2003 | Sakakibara et al. |
| 6,607,962 B2 | 8/2003 | Zekeriya et al. |
| 6,645,821 B2 | 11/2003 | Bailey et al. |
| 6,680,238 B2 | 1/2004 | Song |
| 6,734,076 B1 | 5/2004 | Jaiswal et al. |
| 6,737,326 B2 | 5/2004 | Steinmann et al. |
| 6,770,564 B1 | 8/2004 | Ito et al. |
| 6,809,034 B2 | 10/2004 | Ito et al. |
| 6,815,305 B2 | 11/2004 | Cha |
| 6,933,186 B2 | 8/2005 | Cotte et al. |
| 7,230,517 B1 | 6/2007 | Foote, Jr. et al. |
| 7,291,525 B1 | 11/2007 | Hill |
| 7,332,403 B1 * | 2/2008 | Hill et al. .................... 438/382 |
| 7,410,879 B1 | 8/2008 | Hill et al. |

(Continued)

*Primary Examiner*—Brook Kebede

(57) ABSTRACT

A method is disclosed for eliminating a mask layer during the manufacture of thin film resistor circuits. The method of the present invention enables the simultaneous etching of both deep vias and shallow vias using one mask layer instead of two mask layers. A high selectivity film layer of silicon nitride is formed on the ends of a thin film resistor layer. The thickness of the silicon nitride causes the etch time for a shallow via to the thin film resistor to be approximately equal to an etch time for a deep via that is etched through dielectric material to an underlying patterned metal layer.

20 Claims, 7 Drawing Sheets

U.S. PATENT DOCUMENTS

| | | |
|---|---|---|
| 7,544,579 B1 | 6/2009 | Hill |
| 7,585,775 B1 | 9/2009 | Bold et al. |
| 2002/0132442 A1* | 9/2002 | Kar Roy et al. .............. 438/382 |
| 2004/0012071 A1 | 1/2004 | Ido et al. |
| 2004/0075527 A1 | 4/2004 | Zitzmann et al. |
| 2004/0129673 A1 | 7/2004 | Belyansky et al. |
| 2004/0140508 A1 | 7/2004 | Sengoku et al. |
| 2004/0203241 A1 | 10/2004 | Hampden-Smith et al. |
| 2005/0003673 A1 | 1/2005 | Mahdavi |
| 2007/0037386 A1 | 2/2007 | Williams |
| 2007/0040239 A1* | 2/2007 | Chinthakindi et al. ....... 257/536 |

* cited by examiner

METHOD FOR ELIMINATING A MASK LAYER DURING THIN FILM RESISTOR MANUFACTURING

TECHNICAL FIELD OF THE INVENTION

The present invention is generally directed to the manufacture of semiconductor thin film resistor circuits and, in particular, to a method for eliminating a mask layer during the manufacture of a thin film resistor circuit.

BACKGROUND OF THE INVENTION

In the manufacture of semiconductor thin film resistor circuits it is generally not possible to simultaneously etch both shallow vias and deep vias. A first problem in attempting to simultaneously etch both shallow vias and deep vias is that too much over etch in the shallow vias will create metal contaminated polymers. The metal contaminated polymers are difficult, if not impossible, to remove in a subsequent ash and solvent step. A second problem in attempting to simultaneously etch both shallow vias and deep vias is that too little etch in the deep vias will leave the via open. A third problem is that the amount of etch required to completely etch the deep via without etching through the end cap metal in the shallow via would necessitate an excessive thickness of end cap metal. A thicker end cap metal degrades an important electrical parameter called resistor matching.

These problems are avoided in the prior art by employing two separate mask layers. A first mask layer is applied and then the deep vias are etched. Then the first mask layer is removed and a second mask layer is applied and the shallow vias are etched. The deep vias and the shallow vias are etched separately. The order can be reversed in that the shallow vias can be etched first and the deep vias etched second.

There is a need in the art for a method in which deep vias and shallow vias can be etched simultaneously. There is also a need in the art for a method in which deep vias and shallow vias can be etched simultaneously using only one mask layer and one etch process.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
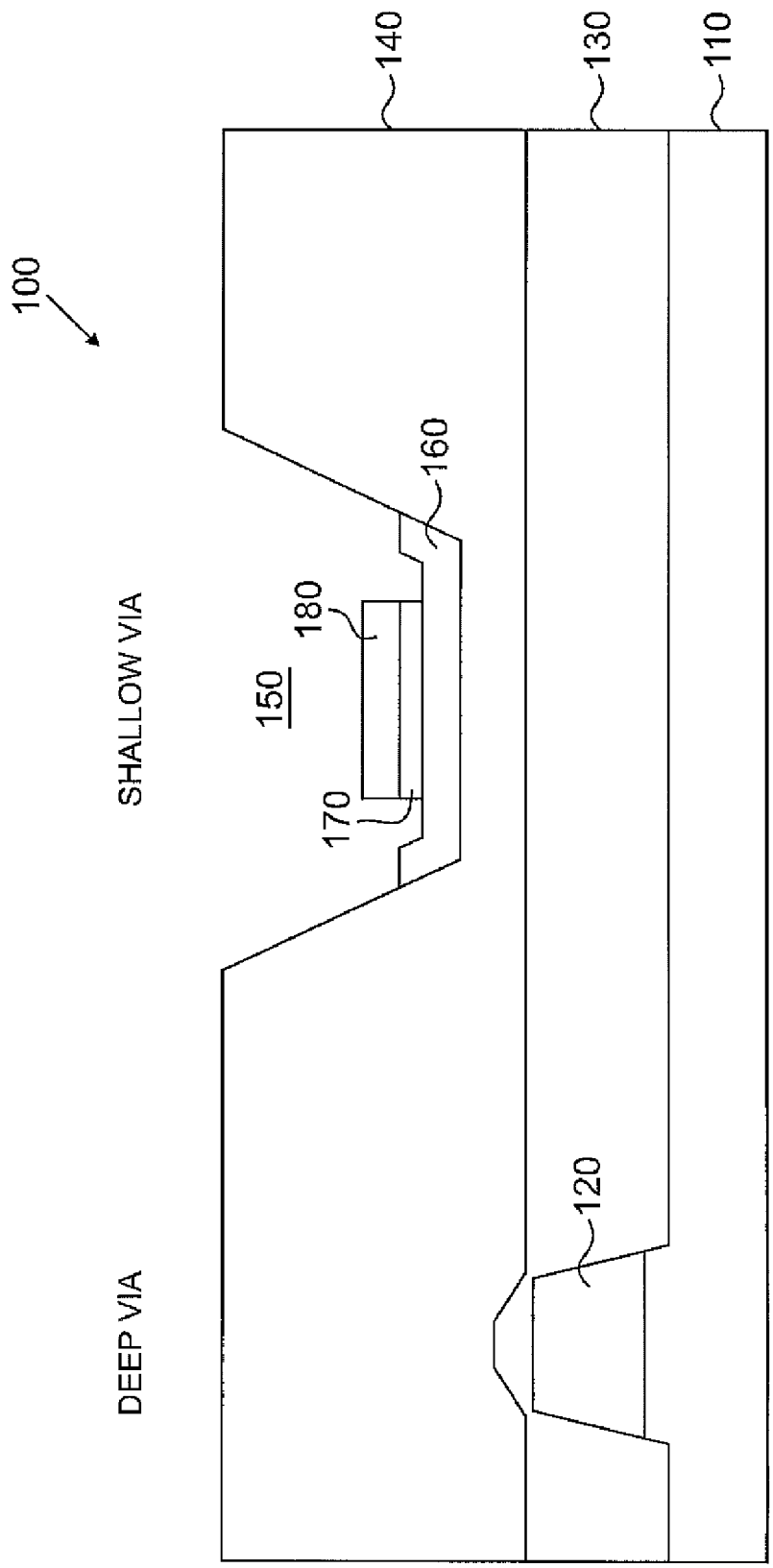
FIG. 1 illustrates a schematic diagram showing a cross sectional end view of a first stage of manufacture of a first advantageous embodiment of a thin film resistor of the present invention.

FIGS. 1 through 7 and the various embodiments used to describe the principles of the present invention in this patent document are by way of illustration only and should not be construed in any way to limit the scope of the invention. Those skilled in the art will understand that the principles of the present invention may be implemented in any type of suitably arranged integrated circuit thin film resistor.

To simplify the drawings, the reference numerals from previous drawings will sometimes not be repeated for structures that have already been identified.

The method of the present invention is designed to eliminate a mask layer during the manufacture of a thin film resistor circuit. The method of the present invention is also designed to simultaneously etch both deep vias and shallow vias.

FIG. 1 illustrates a schematic diagram showing a cross sectional end view of a first stage 100 of manufacture of a first advantageous embodiment of a thin film resistor of the present invention. The first stage 100 of manufacture is created by first providing a first silicon dioxide dielectric layer 110 as a base. Then a metal layer 120 is applied and patterned. Then a second silicon dioxide dielectric layer 130 is applied over the metal layer 120 and the first silicon dioxide dielectric layer 110.

Then a third silicon dioxide dielectric layer 140 is applied over the second silicon dioxide dielectric layer 130. The third silicon dioxide dielectric layer 140 is then etched to form a trench 150 to receive the elements of a thin film resistor. The first element of the thin film resistor is an end cap material. The end cap material that is shown in FIG. 1 is a titanium nitride (TiN) layer 160. As shown in FIG. 1, the titanium nitride (TiN) layer 160 is applied at the bottom of the trench 150. A typical thickness of the titanium nitride (TiN) layer 160 is fifteen hundred Ångstroms (1500 Å). An Ångstrom is $10^{-10}$ meter. Other end cap materials may comprise titanium tungsten (TiW) and tantalum nitride (TaN).

Then a silicon carbide chromium (SiCCr) layer 170 is applied over the titanium nitride (TiN) layer 160. A typical thickness of the SiCCr layer 170 is between fifty Ångstroms and one hundred Ångstroms (50 Å to 100 Å). For purposes of clarity in illustration the thickness of the titanium nitride (TiN) layer 160 and the thickness of the SiCCr layer 170 are not drawn to scale in FIG. 1.

In prior art methods a layer of silicon dioxide is usually applied over the SiCCr layer 170. The silicon dioxide forms a protective layer over the thin film resistor. In the method of the present invention, however, a high selectivity film 180 is applied over the SiCCr layer 170. The high selectivity film 180 forms an end cap hard mask over the end of the thin film resistor. The high selectivity film 180 may comprise, for example, silicon nitride, silicon carbide, or silicon oxynitride materials.

In the advantageous embodiment that is shown in FIG. 1 the high selectivity film 180 comprises a silicon nitride ($Si_3N_4$) layer 180. The silicon nitride layer 180 is applied over the SiCCr layer 170. The thickness of the silicon nitride layer 180 is determined by a method that will be more fully described below. A typical value of thickness for the silicon nitride layer 180 is three hundred fifty Ångstroms (350 Å).

Figure 2:
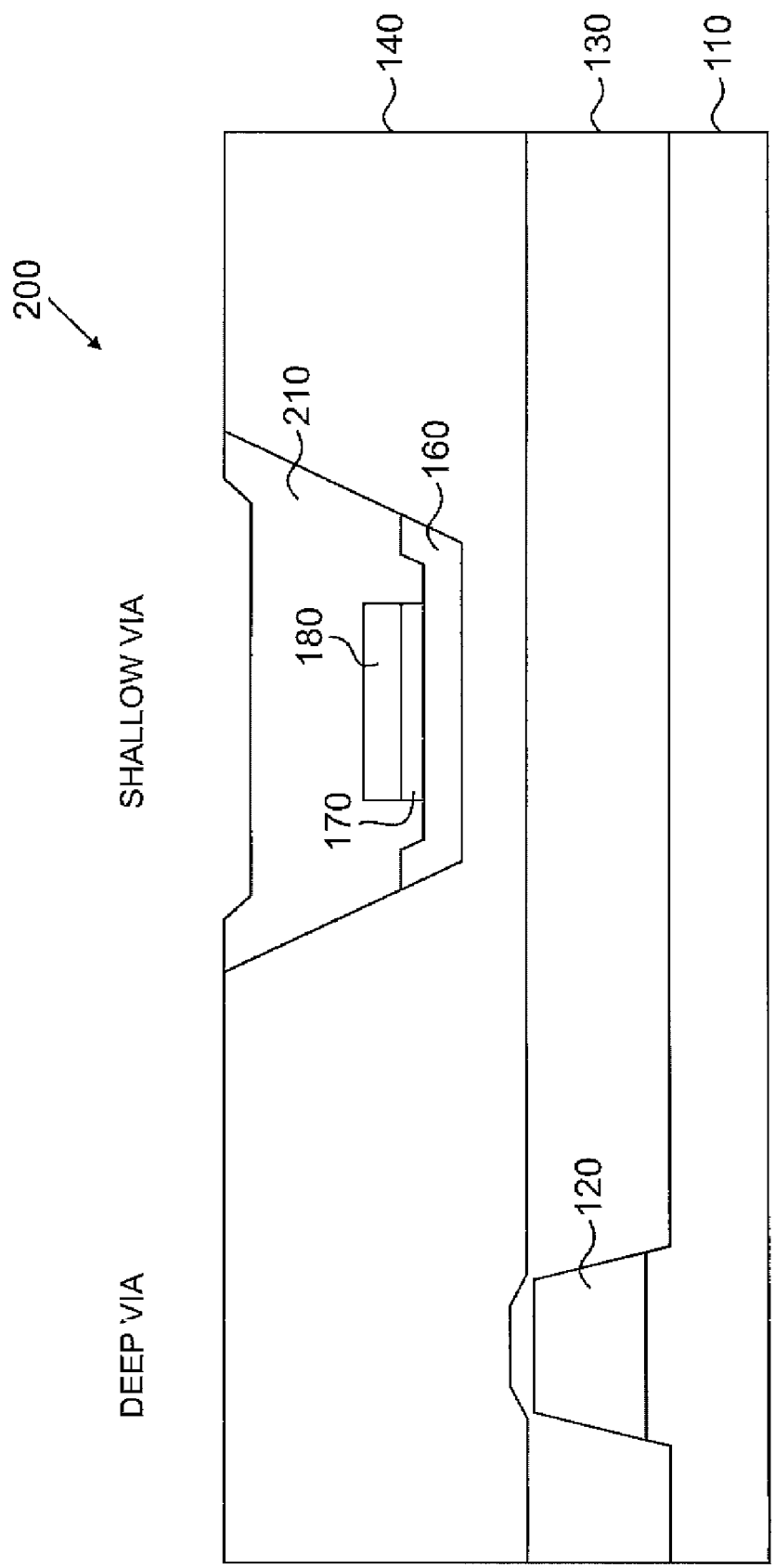
FIG. 2 illustrates a schematic diagram showing a cross sectional end view of a second stage of manufacture of the first advantageous embodiment of a thin film resistor shown in FIG. 1.

FIG. 2 illustrates a schematic diagram showing a cross sectional end view of a second stage 200 of manufacture of the first advantageous embodiment of the thin film resistor shown in FIG. 1. As shown in FIG. 2, a fourth silicon dioxide dielectric layer 210 is applied to fill the trench 150 and cover the elements of the thin film resistor.

Figure 3:
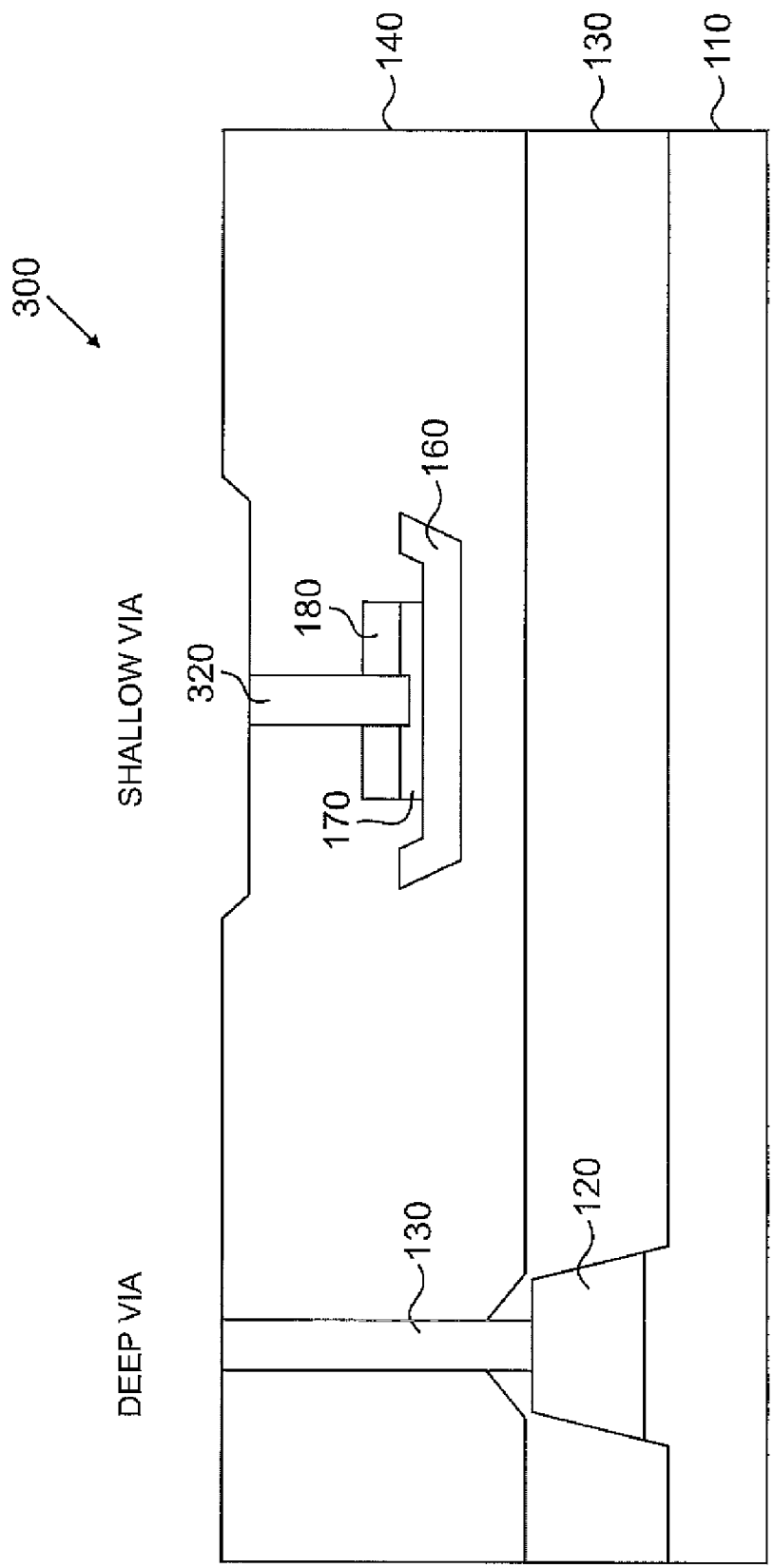
FIG. 3 illustrates a schematic diagram showing a cross sectional end view of a third stage of manufacture of the first advantageous embodiment of a thin film resistor shown in FIG. 2.

FIG. 3 illustrates a schematic diagram showing a cross sectional end view of a third stage 300 of manufacture of the first advantageous embodiment of a thin film resistor shown in FIG. 2. A single mask layer (not shown in FIG. 3) is applied over the third silicon dioxide dielectric layer 140 and the fourth silicon dioxide dielectric layer 210. Then an etch procedure is applied to simultaneously etch a deep via 310 down to the metal layer 120 and a shallow via 320 down to the SiCCr layer 170 that is located under the silicon nitride ($Si_3N_4$) layer 180 (end cap hard mask 180).

The thickness of the silicon nitride ($Si_3N_4$) layer 180 in the method of the invention is adjusted (i.e., selected) so that the effective etch time for the deep via 310 and the effective etch time of the shallow via 320 are very close in value. Then only one mask layer is needed to create both the deep via 310 and the shallow via 320. The selectivity difference between the silicon dioxide ($SiO_2$) material and the silicon nitride ($Si_3N_4$) material in the via etching process makes it possible to select a value of thickness for the relatively thin silicon nitride material that makes the thickness of the silicon nitride material effectively equivalent to a much thicker silicon dioxide layer.

Figure 4:
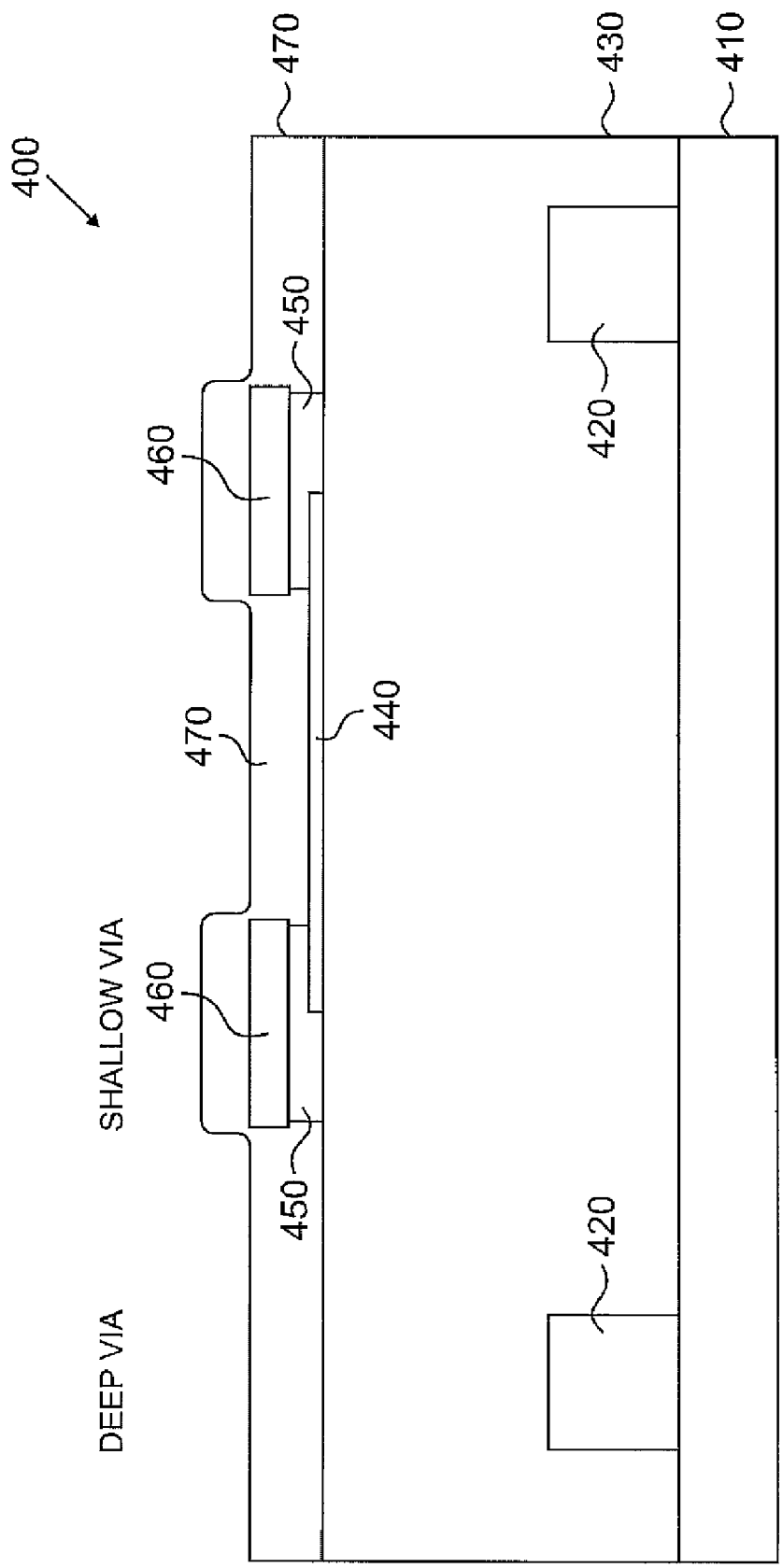
FIG. 4 illustrates a schematic diagram showing a cross sectional transverse view of a first stage of manufacture of a second advantageous embodiment of a thin film resistor of the present invention.

FIG. 4 illustrates a schematic diagram showing a cross sectional transverse view of a first stage 400 of manufacture of a second advantageous embodiment of a thin film resistor of the present invention. The first stage 400 of manufacture is created by first providing a first silicon dioxide dielectric layer 410 as a base. Then a metal layer 420 is applied and patterned. Then a second silicon dioxide dielectric layer 430 is applied over the metal layer 420 and the first silicon dioxide dielectric layer 410.

Then a silicon carbide chromium (SiCCr) layer 440 is applied and patterned over the second silicon dioxide dielectric layer 430. A typical thickness of the SiCCr layer 440 is ninety Ångstroms (90 Å). For purposes of clarity in illustration the thickness of the SiCCr layer 440 and the thickness of the other layers of the thin film resistor are not drawn to scale in FIG. 4.

Then an end cap material 450 is applied over the ends of the SiCCr layer 440. The end cap material that is shown in FIG. 4 is a titanium tungsten (TiW) layer 450. A typical thickness of the titanium tungsten (TiW) layer 450 is one thousand Ångstroms (1000 Å). Other end cap materials may comprise titanium nitride (TiN) and tantalum nitride (TaN).

In prior art methods a layer of silicon dioxide is usually applied over the end cap material layer 450. The silicon dioxide forms an end cap hard mask over the end of the thin film resistor. In the method of the present invention, however, a high selectivity film 460 is applied over the end cap material layer 450. The high selectivity film 460 forms an end cap hard mask over the end of the thin film resistor. The high selectivity film 460 may comprise, for example, silicon nitride, silicon carbide, or silicon oxynitride materials.

In the advantageous embodiment that is shown in FIG. 4 the high selectivity film 460 comprises a silicon nitride ($Si_3N_4$) layer 460. The silicon nitride layer 460 is applied over the end cap material layer 450. The thickness of the silicon nitride layer 460 is determined by a method that will be more fully described below. A typical value of thickness for the silicon nitride layer 460 is one thousand Ångstroms (1000 Å).

Then a third silicon dioxide dielectric layer 470 is applied over the second silicon dioxide dielectric layer 430 and over the silicon nitride layer 460 and over the SiCCr layer 440. A typical value of the thickness of the third dioxide dielectric layer 470 is three thousand Ångstroms (3500 Å).

Figure 5:
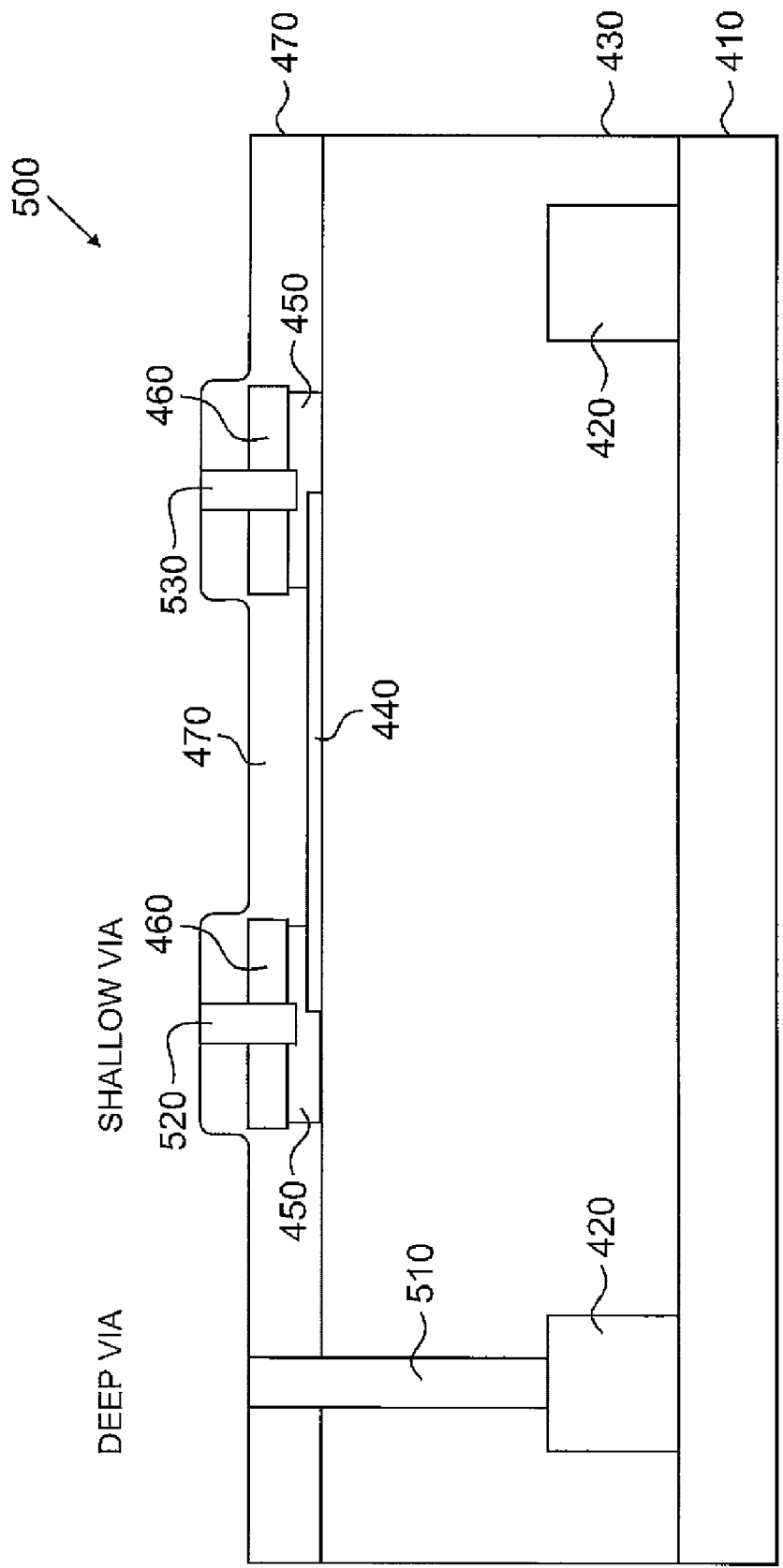
FIG. 5 illustrates a schematic diagram showing a cross sectional transverse view of a second stage of manufacture of the second advantageous embodiment of a thin film resistor shown in FIG. 4.

FIG. 5 illustrates a schematic diagram showing a cross sectional end view of a second stage 500 of manufacture of the second advantageous embodiment of a thin film resistor shown in FIG. 4. A single mask layer (not shown in FIG. 5) is applied over the third silicon dioxide dielectric layer 470. Then an etch procedure is applied to simultaneously etch a deep via 510 down to the metal layer 420 and a first shallow via 520 and a second shallow via 530 down to end cap material layer 450 of titanium tungsten (TiW).

The thickness of the silicon nitride ($Si_3N_4$) layer 460 in the method of the invention is selected so that the effective etch time for the deep via 510 and the effective etch time of the shallow via 520 are very close in value. Then only one mask layer is needed to create both the deep via 510 and the shallow via 520. The selectivity difference between the silicon dioxide material and the silicon nitride material in the via etching process makes it possible to select a value of thickness for the relatively thin silicon nitride material that makes the thickness of the silicon nitride material effectively equivalent to a much thicker silicon dioxide layer.

An example of a prior art method will now be described and compared to an exemplary method of the invention. Assume that the high selectivity film 460 that is shown in FIG. 5 is replaced with a prior art layer of silicon dioxide so that there is a thickness of silicon dioxide of four thousand eight hundred Ångstroms (4800 Å) above the end cap material layer 450 of titanium tungsten (TiW). Further assume that the thickness of the titanium tungsten (TiW) layer 450 has a thickness of one thousand Ångstroms (1000 Å). Further assume that there is a thickness of silicon dioxide of nine thousand eight hundred Ångstroms (9800 Å) above the metal layer 420.

The etch rate for silicon dioxide is six thousand Ångstroms (6000 Å) per minute. The etch time to clear the silicon dioxide over the deep via is given by nine thousand eight hundred Ångstroms (9800 Å) divided by six thousand Ångstroms (6000 Å) per minute. This equals one and six tenths minutes (1.6 min).

The etch time to clear the silicon dioxide over the shallow via is given by four thousand eight hundred Ångstroms (4800 Å) divided by six thousand Ångstroms (6000 Å) per minute. This equals eight tenths of a minute (0.8 min).

The etch rate for titanium tungsten (TiW) three thousand Ångstroms (3000 Å) per minute. The time that the titanium tungsten (TiW) end cap 450 is etched in the shallow via is given by 1.6 minutes minus 0.8 minute. This equals eight tenths of a minute (0.8 min). The amount of titanium tungsten (TiW) that is etched in 0.8 minute is given by three thousand Ångstroms (3000 Å) per minute times 0.8 minute. This equals two thousand four hundred Ångstroms (2400 Å). The titanium tungsten (TiW) end cap 450 having a thickness of one thousand Ångstroms (1000 Å) would be completely etched away. That is why the prior art method cannot simultaneously etch both deep vias and shallow vias. The prior art method requires two separate mask and etch steps.

Now compare the method of the present invention. In one advantageous embodiment the high selectivity film 460 of the present invention comprises a silicon nitride ($Si_3N_4$) layer. After an etch time of eight tenths of a minute (0.8 min) the silicon nitride layer 460 will be exposed in the shallow via 520. A typical ten to one (10:1) selectivity of silicon dioxide to silicon nitride will give a silicon nitride etch rate of six hundred Ångstroms (600 Å) per minute.

Etching the silicon nitride layer 460 at an etch rate of six hundred Ångstroms (600 Å) per minute for eighty seconds (80 sec) will remove only seven hundred eighty Ångstroms (780 Å) of silicon nitride. Therefore a deposited silicon nitride thickness of one thousand Ångstroms (1000 Å) will give a sufficient margin to prevent any etching of the titanium tungsten (TiW) end cap in the shallow via. This means that only one mask and etch step can accomplish the simultaneous etching of deep vias and shallow vias. This means that one mask and etch step can be eliminated from the prior art method that uses two mask and etch steps.

A similar analysis can be performed for the first advantageous embodiment of a thin film resistor of the present invention that is shown in FIGS. 1 through 3.

Although the method of the present invention for etching vias has been described with respect a thin film resistor, it is understood that the method of the present invention is not limited to use with thin film resistors. The thin film resistor structure is merely one example of a semiconductor device in which deep and shallow vias may be simultaneously etched. The method of the present invention may be used with any type of semiconductor device. That is, the method of the present invention may be used to simultaneously etch deep vias and shallow vias in any type of semiconductor device.

Figure 6:
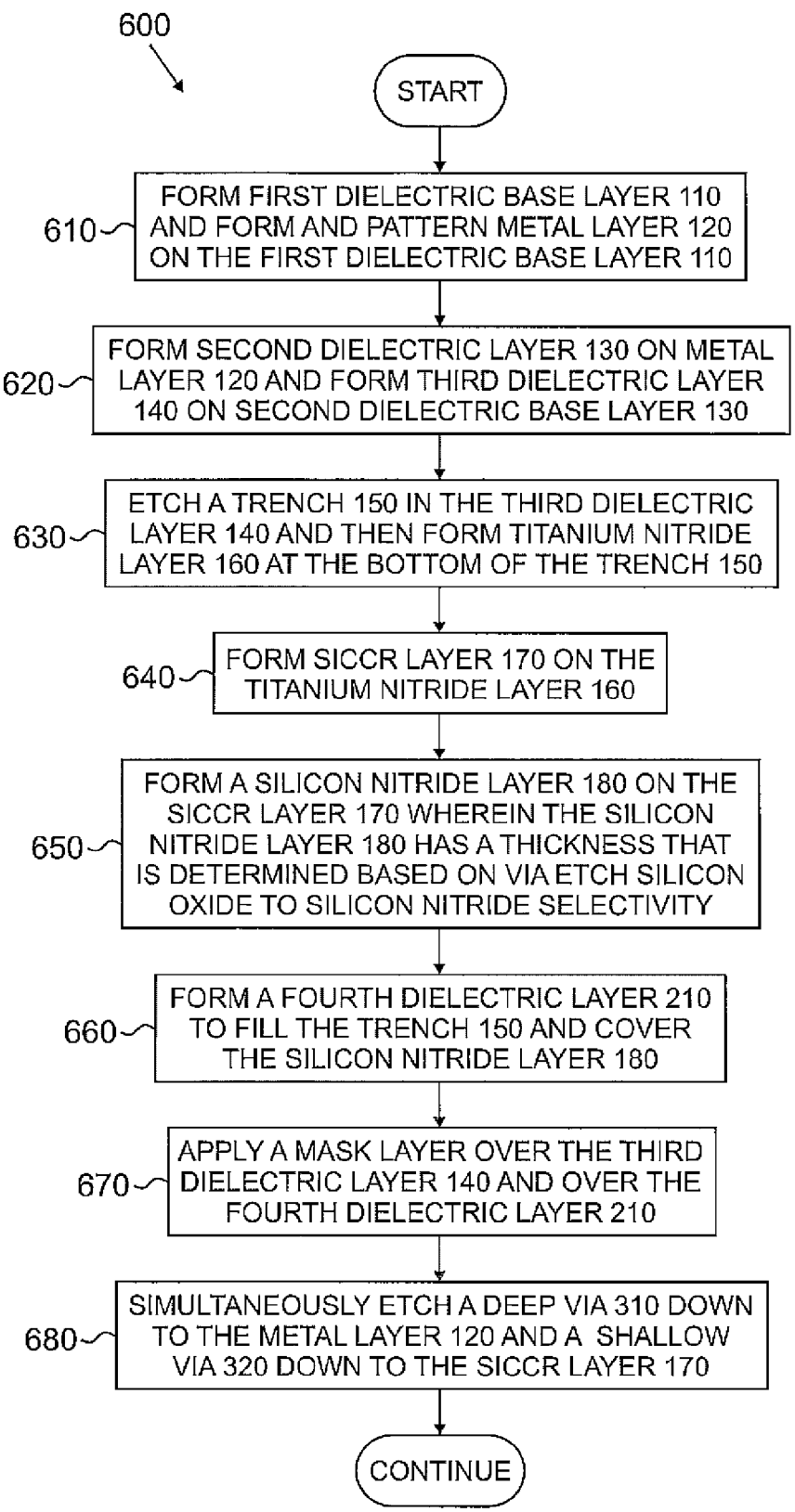
FIG. 6 illustrates a flow chart showing the steps of a first advantageous embodiment of the method of the present invention.

FIG. 6 illustrates a flow chart 600 showing the steps of a first advantageous embodiment of the method of the present invention. In the first step a first silicon dioxide dielectric layer 110 is formed as a base and a metal layer 120 is formed and patterned on the first silicon dioxide dielectric layer 110 (step 610). Then a second silicon dioxide dielectric layer 130 is formed over the metal layer 120 (and over the first silicon dioxide dielectric layer 110) and then a third silicon dioxide dielectric layer 140 is formed on the second silicon dioxide dielectric layer 130 (step 620).

Then the third silicon dielectric layer 140 is etched to form a trench 150 and a titanium nitride (TiN) layer 160 is formed as an end cap material at the bottom of the trench 150 (step 630).

Then a silicon carbide chromium (SiCCr) layer 170 is formed on the titanium nitride (TiN) layer 160 (step 640). Then a silicon nitride layer 180 (high selectivity film 180) is formed over the SiCCr layer 170 wherein the silicon nitride layer 180 has a thickness that is determined based on via etch silicon oxide to silicon nitride selectivity (step 650).

Then a fourth silicon dioxide dielectric layer 210 is formed to fill the trench 150 and cover the silicon nitride layer 180 (step 660). Then a mask layer is applied over the third dielectric layer 140 and over the fourth silicon dioxide dielectric layer 210 (step 670). Then a deep via 310 is etched down to the metal layer 120 and a shallow via 320 is simultaneously etched down to the silicon carbide chromium (SiCCr) layer 170 (step 680).

Figure 7:
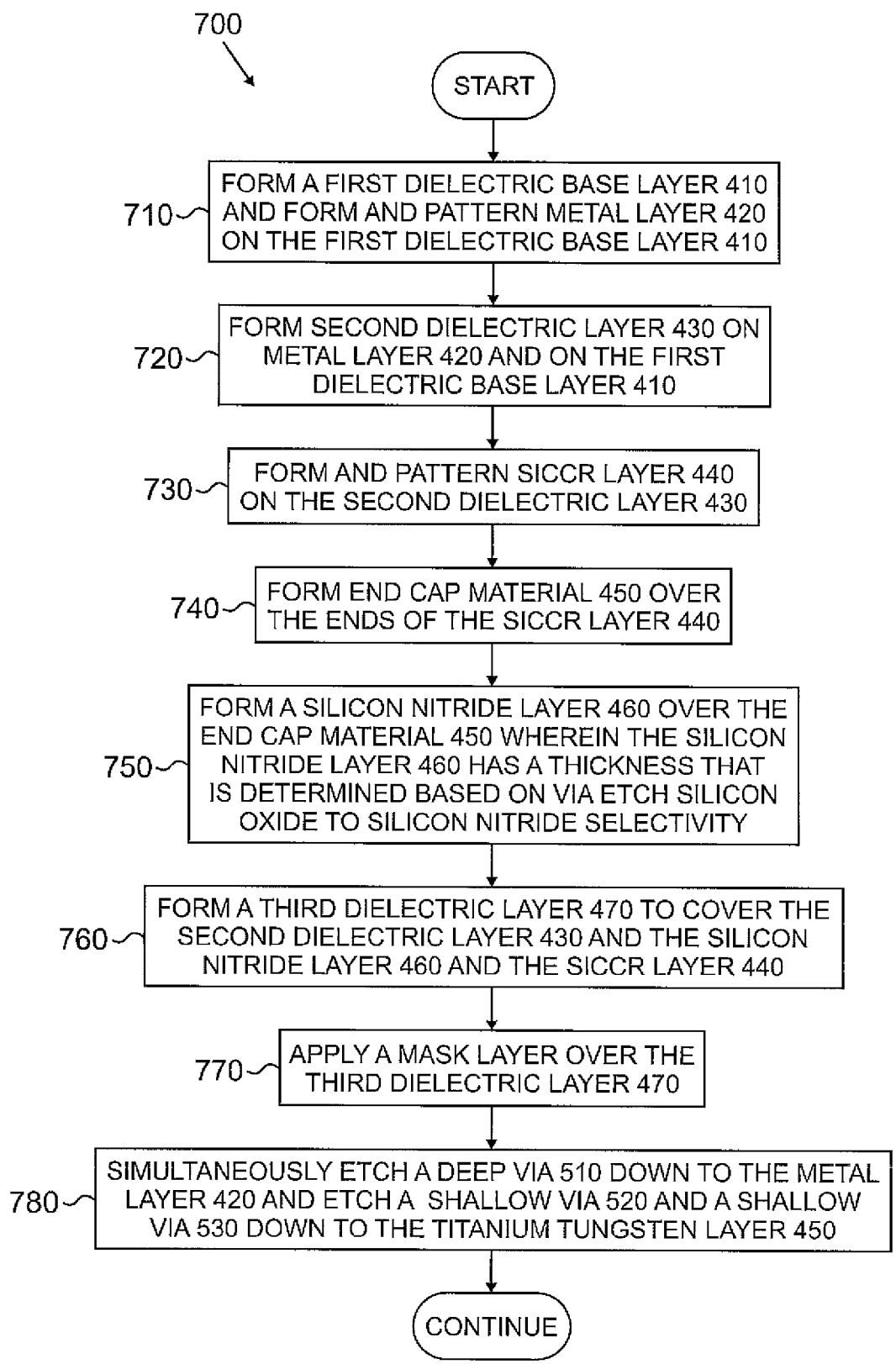
FIG. 7 illustrates a flow chart showing the steps of a second advantageous embodiment of the method of the present invention.

FIG. 7 illustrates a flow chart 700 showing the steps of a second advantageous embodiment of the method of the present invention. In the first step a first silicon dioxide dielectric layer 410 is formed as a base and a metal layer 420 is formed and patterned on the first silicon dioxide dielectric layer 410 (step 710). Then a second silicon dioxide dielectric layer 430 is formed over the metal layer 420 and over the first silicon dioxide dielectric layer 410 (step 720). Then a silicon carbide chromium (SiCCr) layer 440 is formed and patterned over the second silicon dioxide dielectric layer 430 (step 730).

Then an end cap material 450 (e.g., titanium tungsten (TiW)) is formed over the ends of the SiCCr layer 440 (step 740). Then a silicon nitride layer 460 (high selectivity film 460) is formed over the end cap material 450 wherein the silicon nitride layer 460 has a thickness that is determined based on via etch silicon oxide to silicon nitride selectivity (step 750).

Then a third silicon dioxide dielectric layer 470 is formed over the second silicon dioxide dielectric layer 430 and over the silicon nitride layer 460 and over the SiCCr layer 440 (step 760). Then a mask layer is applied over the third silicon dioxide dielectric layer 470 (step 770). Then a deep via 510 is etched down to the metal layer 420 and simultaneously a shallow via 520 and a shallow via 530 are etched down to the end cap material layer 450 of titanium tungsten (TiW) (step 780).

It may be advantageous to set forth definitions of certain words and phrases that have been used within this patent document. The term "couple" and its derivatives refer to any direct or indirect communication between two or more components, whether or not those components are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The term "each" means every one of at least a subset of the identified items. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for manufacturing a thin film resistor comprising the steps of:
   forming a first dielectric layer;
   forming a thin film resistor layer over the first dielectric layer;
   forming an end cap material layer over an end of the thin film resistor layer;
   forming a high selectivity film layer over the end cap material layer;
   forming a second dielectric layer over the first dielectric layer and over the high selectivity film layer and over the thin film resistor layer;
   applying a mask layer over the second dielectric layer; and
   etching a shallow via through the second dielectric layer and through the high selectivity film layer to the end cap material layer;
   wherein the high selectivity film layer is formed to have a thickness that is determined based on a difference in selectivity between the high selectivity film layer and the second dielectric layer.

2. The method as set forth in claim 1 wherein the high selectivity film comprises one of: silicon nitride, silicon carbide, and silicon oxynitride material.

3. The method as set forth in claim 2 wherein:
the high selectivity film comprises silicon nitride; and
the thickness of the high selectivity film is determined based on a difference in via etch selectivity between silicon oxide and silicon nitride.

4. The method as set forth in claim 3 wherein the thickness of the high selectivity film causes an etch time for the shallow via to be approximately equal to an etch time for a deep via that is simultaneously etched down to a patterned metal layer located in an underlying dielectric layer at a level lower than a level of the thin film resistor layer.

5. The method as set forth in claim 4 wherein the shallow via and the deep via are simultaneously etched using one mask layer.

6. The method as set forth in claim 1 wherein the end cap material layer comprises one of: titanium tungsten, titanium nitride and tantalum nitride.

7. A method for manufacturing a thin film resistor comprising the steps of:
forming a first dielectric layer;
etching a trench in the first dielectric layer;
forming an end cap material layer in the trench;
forming a thin film resistor layer over the end cap material layer;
forming a high selectivity film layer over the thin film resistor layer;
forming a second dielectric layer that fills the trench and covers the high selectivity film layer;
applying a mask layer over the first and second dielectric layers; and
etching a shallow via through the second dielectric layer and through the high selectivity film layer to the thin film resistor layer;
wherein the high selectivity film layer is formed to have a thickness that is determined based on a difference in selectivity between the high selectivity film layer and the second dielectric layer.

8. The method as set forth in claim 7 wherein the high selectivity film comprises one of: silicon nitride, silicon carbide, and silicon oxynitride material.

9. The method as set forth in claim 8 wherein:
the high selectivity film comprises silicon nitride; and
the thickness of the high selectivity film is determined based on a difference in via etch selectivity between silicon oxide and silicon nitride.

10. The method as set forth in claim 9 wherein the thickness of the high selectivity film causes an etch time for the shallow via to be approximately equal to an etch time for a deep via that is simultaneously etched down to a patterned metal layer located in an underlying dielectric layer at a level lower than a level of the thin film resistor layer.

11. The method as set forth in claim 10 wherein the shallow via and the deep via are simultaneously etched using one mask layer.

12. The method as set forth in claim 7 wherein the end cap material layer comprises one of: titanium tungsten, titanium nitride and tantalum nitride.

13. A method for manufacturing a thin film resistor comprising the steps of:
forming a first dielectric layer;
forming a patterned metal layer over the first dielectric layer;
forming a second dielectric layer over the patterned metal layer;
forming a trench in the second dielectric layer;
forming an end cap material layer in the trench;
forming a thin film resistor layer over the end cap material layer;
forming a high selectivity film over the thin film resistor layer;
forming a third dielectric layer that fills the trench and covers the high selectivity film layer;
applying a mask layer over the second and third dielectric layers;
etching a shallow via through the third dielectric layer and through the high selectivity film layer to the thin film resistor layer; and
simultaneously etching a deep via through the second dielectric layer down to the patterned metal layer;
wherein the high selectivity film is formed to have a thickness that is determined based on a selectivity of each of the high selectivity film, the second dielectric layer, and the third dielectric layer.

14. The method as set forth in claim 13 wherein the high selectivity film comprises one of: silicon nitride, silicon carbide, and silicon oxynitride material.

15. The method as set forth in claim 13 wherein:
the high selectivity film comprises silicon nitride; and
the thickness of the high selectivity film is determined based on a difference in via etch selectivity between silicon oxide and silicon nitride.

16. The method as set forth in claim 15 wherein the thickness of the high selectivity film causes an etch time for the shallow via to be approximately equal to an etch time for the deep via.

17. A method for manufacturing a thin film resistor comprising the steps of:
forming a first dielectric layer;
forming a patterned metal layer over the first dielectric layer;
forming a second dielectric layer over the patterned metal layer;
forming a thin film resistor layer over the second dielectric layer;
forming an end cap material layer over an end of the thin film resistor layer;
forming a high selectivity film layer over the end cap material layer;
forming a third dielectric layer over the second dielectric layer and over the high selectivity film layer and over the thin film resistor layer;
applying a mask layer over the third dielectric layer;
etching a shallow via through the third dielectric layer and through the high selectivity film layer to the end cap material layer; and
simultaneously etching a deep via through the third dielectric layer and the second dielectric layer down to the patterned metal layer;
wherein the high selectivity film is formed to have a thickness that is determined based on a selectivity of each of the high selectivity film, the second dielectric layer, and the third dielectric layer.

18. The method as set forth in claim 17 wherein the high selectivity film comprises one of: silicon nitride, silicon carbide, and silicon oxynitride material.

19. The method as set forth in claim 18 wherein:
the high selectivity film comprises silicon nitride; and
the thickness of the high selectivity film is determined based on a difference in via etch selectivity between silicon oxide and silicon nitride.

20. The method as set forth in claim 19 wherein the thickness of the high selectivity film causes an etch time for the shallow via to be approximately equal to an etch time for the deep via.

* * * * *